(12) United States Patent
Liu et al.

(10) Patent No.: US 7,525,388 B2
(45) Date of Patent: Apr. 28, 2009

(54) BIAS CIRCUITS AND SIGNAL AMPLIFIER CIRCUITS

(75) Inventors: Zhi-Yuan Liu, Taipei (TW); Yi-Jan Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 11/808,678

(22) Filed: Jun. 12, 2007

(65) Prior Publication Data

US 2008/0143444 A1    Jun. 19, 2008

(30) Foreign Application Priority Data

Dec. 13, 2006  (TW) .................................. 95146613

(51) Int. Cl.
*H03F 3/04* (2006.01)
(52) U.S. Cl. ...................................... 330/296; 330/285
(58) Field of Classification Search .................. 330/285, 330/261, 296
See application file for complete search history.

(56) References Cited

U.S. PATENT DOCUMENTS

| | | | |
|---|---|---|---|
| 6,639,465 B2 | 10/2003 | Samelis et al. | |
| 6,684,064 B2 | 1/2004 | Kazakevich et al. | |
| 6,765,443 B2 | 7/2004 | Pehike | |
| 6,809,593 B1 * | 10/2004 | Newman et al. | 330/285 |
| 6,819,180 B2 | 11/2004 | Krvavac | |
| 6,859,103 B2 * | 2/2005 | Yeh | 330/285 |
| 6,882,227 B2 * | 4/2005 | Barry et al. | 330/296 |
| 7,005,923 B2 | 2/2006 | Noh et al. | |
| 7,010,282 B2 | 3/2006 | Kazakevich et al. | |

* cited by examiner

*Primary Examiner*—Henry K Choe
(74) *Attorney, Agent, or Firm*—Muncy, Geissler, Olds & Lowe, PLLC

(57) ABSTRACT

A bias circuit includes a transistor having a control gate, a first terminal and a second terminal coupled to a ground level, a first resistor coupled to the control gate, a first capacitor coupled between an input signal and the first resistor, a diode coupled between a connection point of the first capacitor and the first resistor, and the ground level, a second capacitor coupled between the control gate and the ground level, a second resistor coupled between the control gate and the ground level, a third resistor coupled between the control gate and a predetermined voltage, a fourth resistor coupled between the predetermined voltage and the first terminal, and a fifth resistor coupled between the first terminal and a bias signal. A current through the transistor corresponds to the input signal, and the bias signal is generated according to the current through the transistor.

23 Claims, 4 Drawing Sheets

BIAS CIRCUITS AND SIGNAL AMPLIFIER CIRCUITS

BACKGROUND OF THE INVENTION

1. Field of the Invention

The invention relates to a signal amplifier circuit, and more particularly to a signal amplifier circuit with an adaptive bias.

2. Description of the Related Art

In amplifier application, efficiency and linearity are major considerations. For current wireless communication systems, radio frequency (RF) power amplifier (PA) consumes a majority of the power for portable products. Consequently, a conventional method to extend operation and standby time of wireless communication systems is improving the efficiency of the PA.

In the application of some wireless systems, the bias of the conventional PA is operated at a fixed voltage. PA often operates at 6-8 dB backed off from $P_{1dB}$ (1 dB compression point) to satisfy the linearity requirements of the system, such that PA generally operates in a low-efficiency state. For example, for orthogonal frequency division multiplexing (OFDM) modulation techniques used in wireless local area network (WLAN), specific data sequences lead to a high peak to peak ratio (PARR) of the output signal. PA needs to operate in wider linear region to reduce distortion of the transmitted signal, thus PA generally operates in low-efficiency region. For example, the average of power added efficiency (PAE) of complementary metal oxide semiconductor (CMOS) RF PA is generally below 10%.

For both efficiency and linearity, the conventional technique receives the peak level of the signal by a coupler and power detector first, and then transforms the signal into a bias signal through DC/DC converter to enhance PAE. However, the bias circuit comprising the coupler, power detector and DC/DC converter is not easy to integrate into a transmitter due to high costs and large size.

BRIEF SUMMARY OF THE INVENTION

Adaptive bias circuits and signal amplifier circuits are provided. An exemplary embodiment of a bias circuit comprises a transistor, five resistors, two capacitors and a diode. The transistor has a control gate, a first terminal and a second terminal coupled to a ground level. A first resistor is coupled to the control gate. A first capacitor is coupled between an input signal and the first resistor. The diode is coupled between a connection point of the first capacitor and the first resistor and the ground level. A second capacitor is coupled between the control gate and the ground level. A second resistor is coupled between the control gate and the ground level. A third resistor is coupled between the control gate and a predetermined voltage. A fourth resistor is coupled between the predetermined voltage and the first terminal. A fifth resistor is coupled between the first terminal and a bias signal. A current through the transistor corresponds to the input signal, and the bias signal is generated according to the current through the transistor.

An exemplary embodiment of a signal amplifier circuit comprises an amplifier, a first capacitor and a bias adjustment circuit. The amplifier generates an output signal according to an input signal and a bias signal. The first capacitor is coupled between the input signal and the amplifier. The bias adjustment circuit is coupled between the input signal and the amplifier, and comprises a rectifier circuit adjusting a waveform of the input signal to generate a rectifier signal, a filter circuit generating a DC signal according to the rectifier signal, and a bias circuit generating the bias signal to the amplifier according to the DC signal.

Another exemplary embodiment of a signal amplifier circuit comprises an amplifier, a transistor, a diode, five resistors and three capacitors. The amplifier generates an output signal according to an input signal and a bias signal. A first capacitance is coupled between the input signal and the amplifier. The transistor has a control gate, a first terminal and a second terminal coupled to a ground level. A first resistor is coupled to the control gate. A second capacitor is coupled between the input signal and the first resistor. The diode is coupled between a connection point of the second capacitor and the first resistor and the ground level. A third capacitor is coupled between the control gate and the ground level. A second resistor is coupled between the control gate and a predetermined voltage. A third resistor is coupled between the control gate and the ground level. A fourth resistor is coupled between the predetermined voltage and the first terminal. A fifth resistor is coupled between the first terminal and the amplifier. A current through the transistor corresponds to the input signal, and the bias signal is generated according to the current through the transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
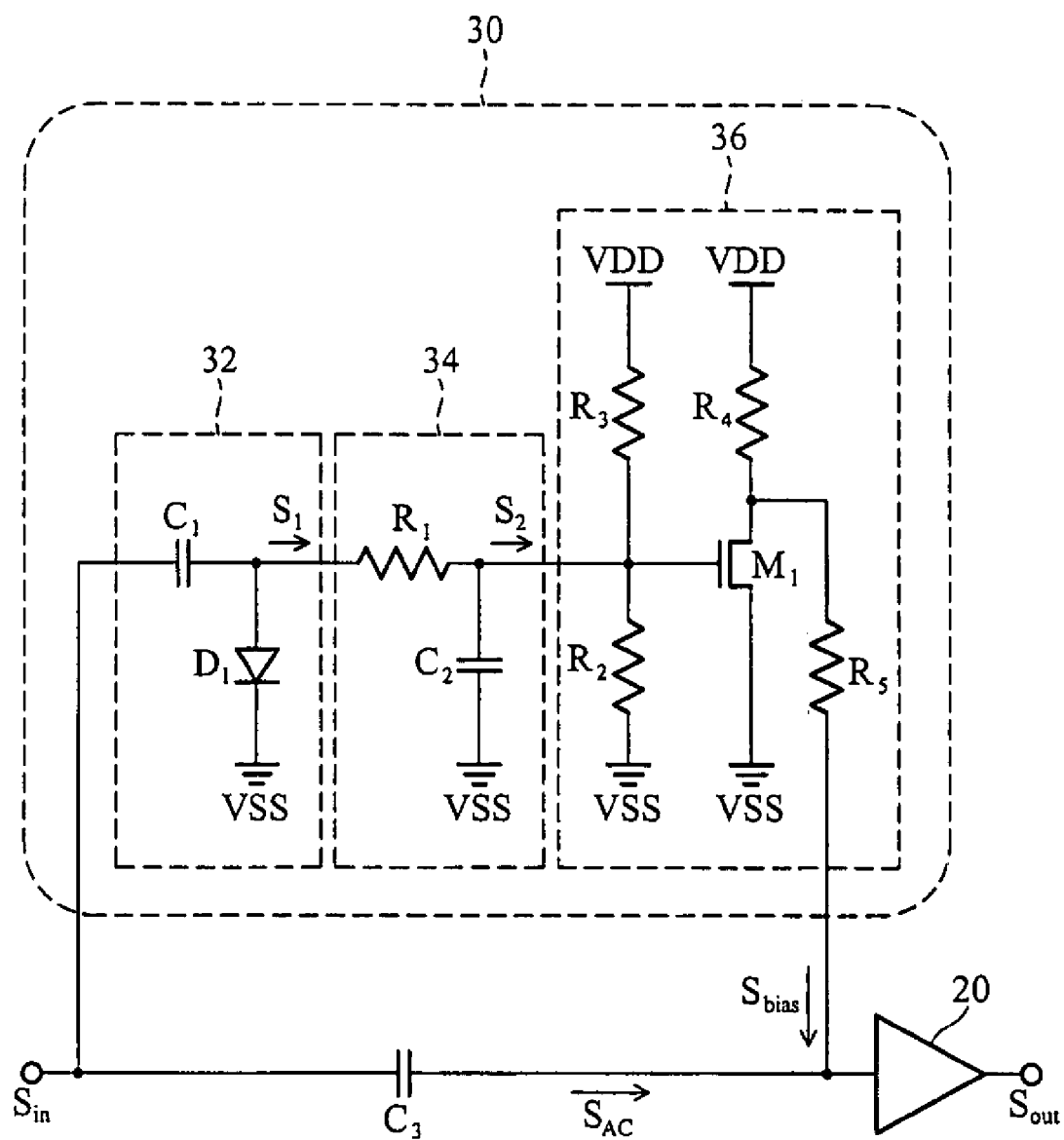
FIG. 1 shows a power amplifier circuit according to an embodiment of the invention.

FIG. 1 shows a power amplifier (PA) circuit 10 according to an embodiment of the invention. In FIG. 1, PA circuit 10 comprises a capacitor $C_3$, an amplifier 20 and a bias adjustment circuit 30, and generates an output signal $S_{out}$ by amplifying an input signal $S_{in}$. Capacitor $C_3$ is coupled between input signal $S_{in}$ and amplifier 20, and the AC part of input signal $S_{in}$ is passed through capacitor $C_3$ to generate a signal $S_{AC}$. Bias adjustment circuit 30 comprises rectifier circuit 32, filter circuit 34 and bias circuit 36.

As shown in FIG. 1, rectifier circuit 32, a half wave rectifier consisting of capacitor $C_1$ and diode $D_1$, receives a small fraction of input signal $S_{in}$ to generate a rectifier signal $S_1$, wherein the AC part of input signal $S_{in}$ is passed through capacitor $C_1$ which blocks the DC component of input signal $S_{in}$. Furthermore, diode $D_1$ is coupled to VSS with forward bias direction, thus the voltage of rectifier signal S1 generated by rectifier circuit 32 is less than or equal to the forward bias voltage of diode $D_1$, i.e. 0.7V. Filter circuit 34 is a low pass filter (LPF) consisting of resistor $R_1$ and capacitor $D_2$, and transforms rectifier signal $S_1$ into a DC signal $S_2$. As power of input signal $S_{in}$ increases, voltage of DC signal $S_2$ drops. In addition, the bandwidth of bias adjustment circuit 30 is determined by resistor $R_1$ and capacitor $C_2$.

Bias circuit 36 comprises resistors $R_2$-$R_5$ and transistor $M_1$. Transistor $M_1$ is operated in the saturation region as a voltage-controlled current source. The gate voltage of transistor $M_1$ is determined by DC signal $S_2$ from filter circuit 34 and the voltage divided by resistor $R_2$ and resistor $R_3$. Then, the drain voltage of transistor $M_1$ is used to bias the amplifier 20 through resistor $R_5$ as a bias signal $S_{bias}$. Amplifier 20 finally generates an output signal $S_{out}$ according to signal $S_{AC}$ and bias signal $S_{bias}$. Since VDD and VSS are constant, the voltage divided by resistor $R_2$ and resistor $R_3$ is also a constant value. The voltage of DC signal $S_2$ is decreased as power of input signal $S_{in}$ is increased. The gate voltage of transistor $M_1$ is decreased accordingly, and the drain voltage of transistor $M_1$ is increased as drain current of transistor $M_1$ is decreased. Thus, the bias signal $S_{bias}$ transmitting to amplifier 20 is increased with the power of input signal $S_{in}$.

In another embodiment of the invention, diode $D_1$ is a diode-connected transistor. Filter circuit 34 can comprise inductances or higher order filters. Moreover, transistor $M_1$ can be a metal oxide semiconductor (MOS) transistor, field effect transistor (FET), bipolar junction transistor (BJT) or Heterojunction bipolar transistor (HBT). All resistors and capacitors shown in FIG. 1 can be formed by transistors, similarly.

Figure 2:
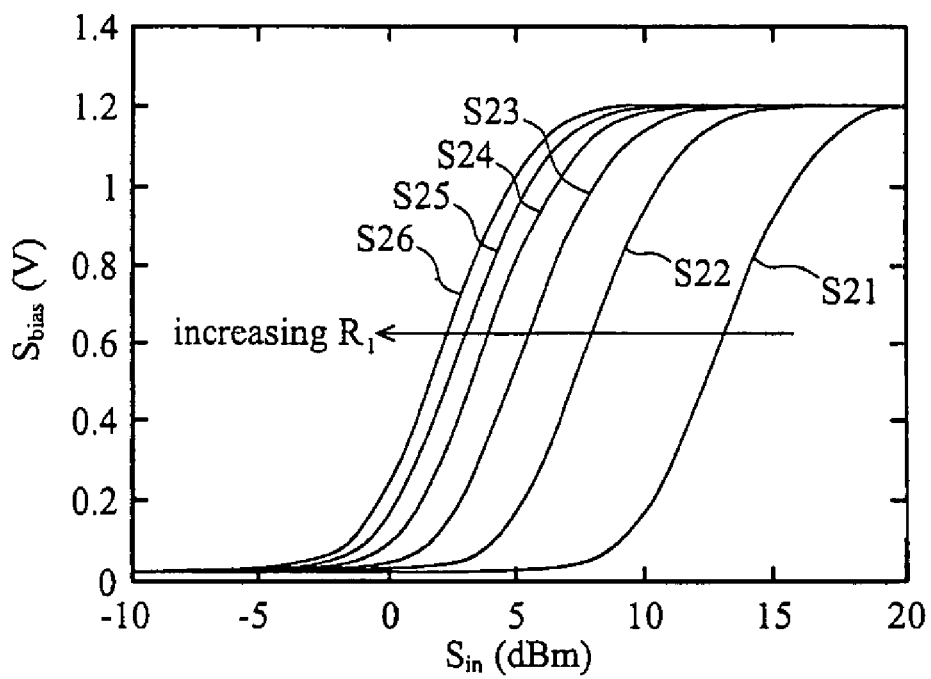
FIG. 2 is a relational diagram of the input signal and bias signal shown in FIG. 1.
Figure 3:
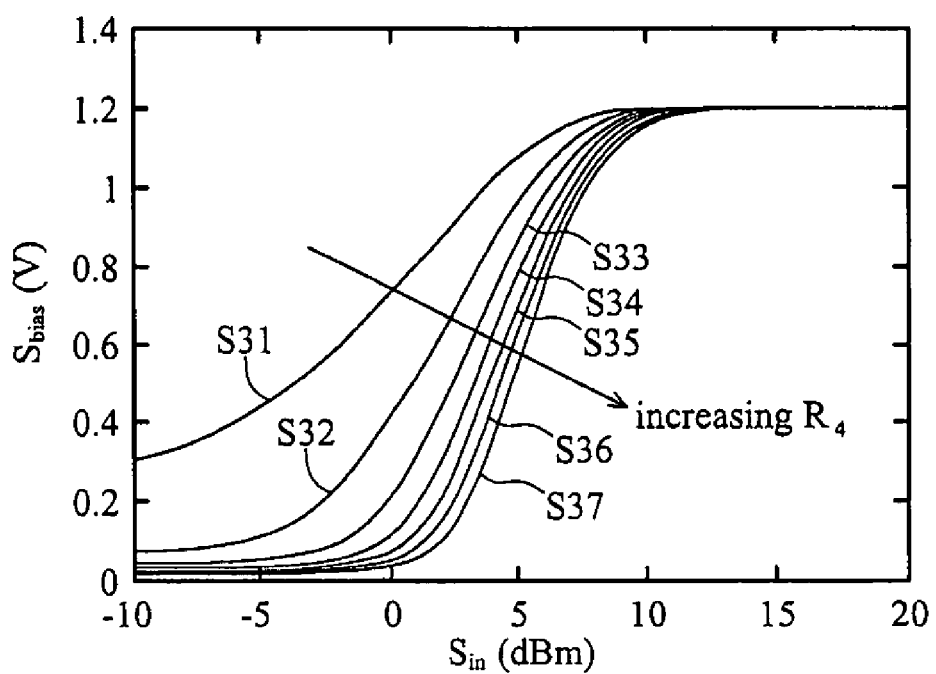
FIG. 3 is another relational diagram of the input signal and bias signal shown in FIG. 1.

FIG. 2 is a relational diagram of input signal $S_{in}$ and bias signal $S_{bias}$ shown in FIG. 1. As shown, curves S21-S26 represent the characteristic curve of bias signal $S_{bias}$ with respect to input signal $S_{in}$ for resistor $R_1$ increasing respectively. The resistances of resistor $R_1$ varying from curve S21 to curve S26 are increased gradually, i.e. resistor $R_1$ of curve S21 is the minimum and resistor $R_1$ of curve S26 is the maximum. Compared with curves S21-S25, Curve S26 has the highest level of bias signal $S_{bias}$ with the same input signal $S_{in}$. A ratio of resistor $R_2$ and resistor $R_3$ is similarly controlled to adjust the level of bias signal $S_{bias}$. FIG. 3 is another relational diagram of input signal $S_{in}$ and bias signal $S_{bias}$ shown in FIG. 1. As shown in FIG. 3, curves S31-S37 represent the characteristic of bias signal $S_{bias}$ with respect to input signal $S_{in}$ for resistor $R_4$ increasing respectively. The resistances of resistor $R_4$ varying from curve S31 to curve S37 are increased gradually, i.e. resistor $R_4$ of curve S31 is the minimum and resistor $R_4$ of curve S37 is the maximum. When resistor $R_4$ is increased, a slope of characteristic curve is increased and the level of bias signal $S_{bias}$ is decreased.

Figure 4:
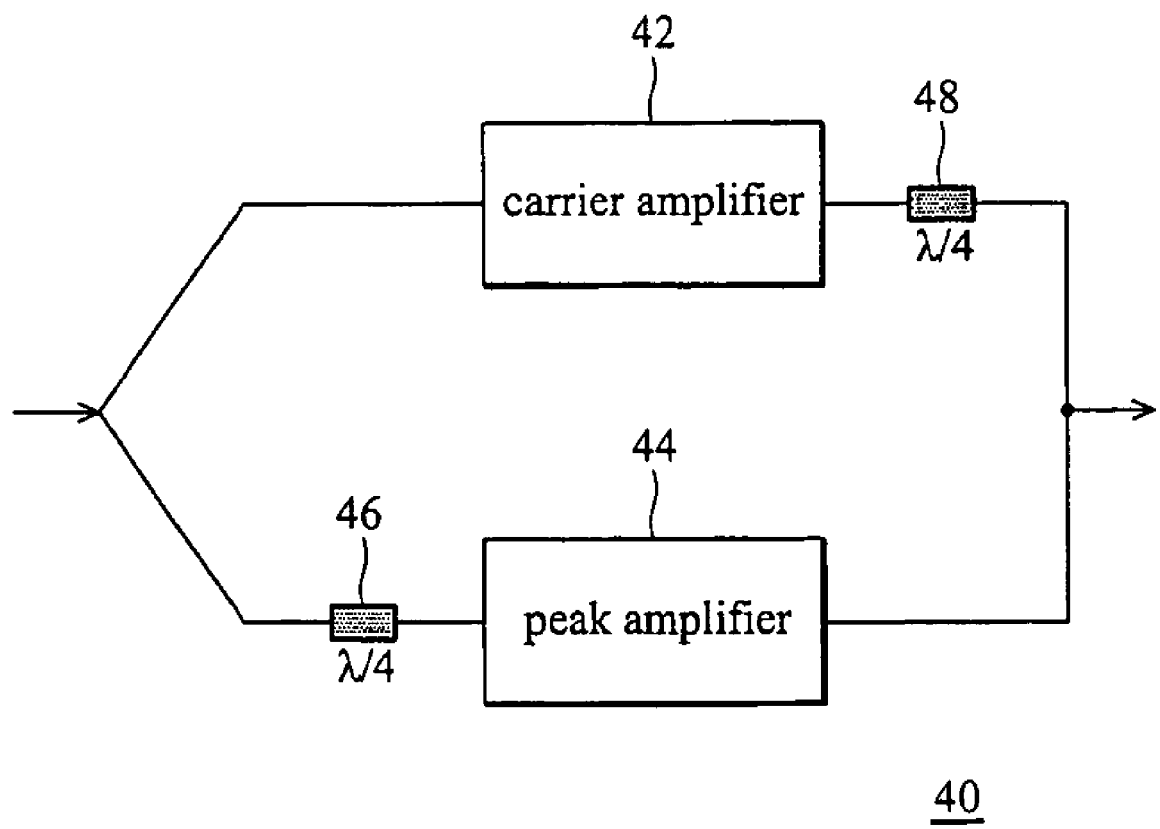
FIG. 4 shows a Doherty PA according to an embodiment of the invention.

FIG. 4 shows a Doherty PA 40 according to an embodiment of the invention. Doherty PA 40 comprises carrier amplifier 42, peak amplifier 44 and two quarter length transmission lines ($\lambda/4$) 46, 48 wherein the peak amplifier 44 comprises PA circuit 10 shown in FIG. 1.

Figure 5:
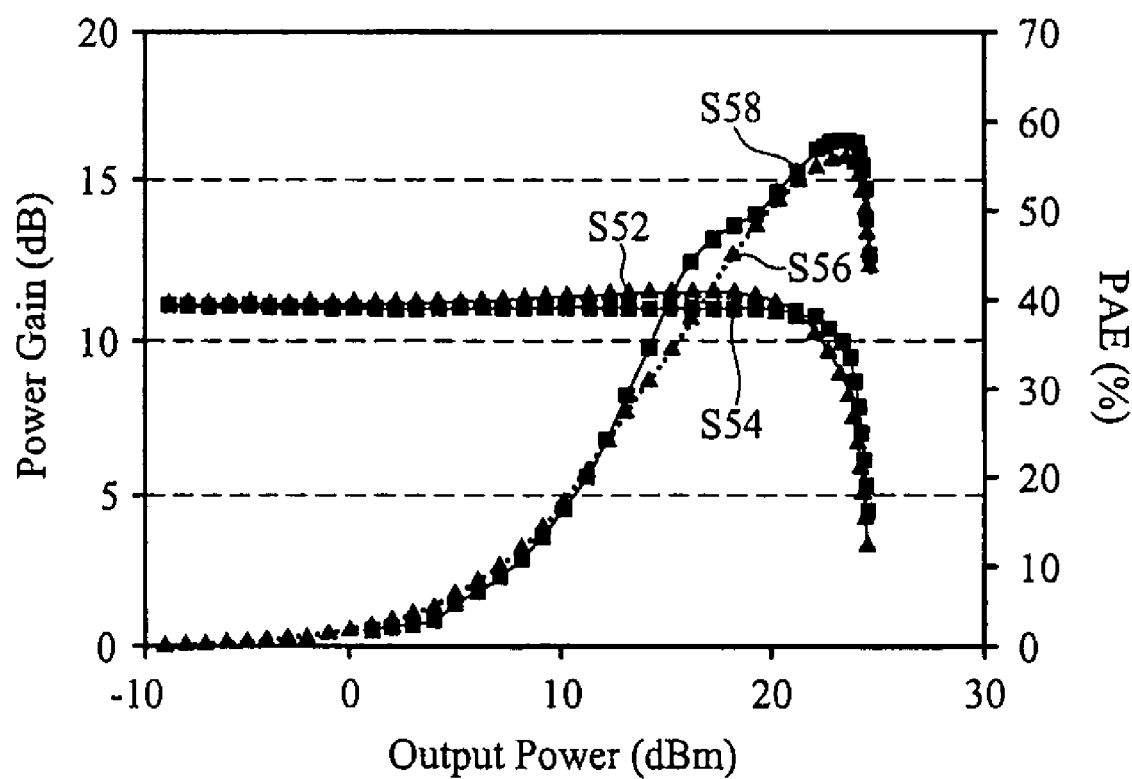
FIG. 5 shows PAE and power gain of a conventional Doherty PA and the Doherty PA shown in FIG. 4.

FIG. 5 shows PAE and power gain of a conventional Doherty PA and Doherty PA 40 shown in FIG. 4. Curve S52 and curve S54 represent the power gain of conventional Doherty PA and Doherty PA according to the invention respectively; and Curve S56 and curve S58 represent the PAE of conventional Doherty PA and Doherty PA according to the invention respectively. As shown in curve S54, power gain is flattened and bandwidth increased. As shown in curve S58, the PAE of Doherty PA according to the invention is improved.

While rectifier circuit 32, filter circuit 34 and bias circuit 36 described in FIG. 1 comprise simple components, it is to be understood that the invention is not limited thereto. Furthermore, the invention can be implemented by various processes of integrated circuit, such as complementary metal oxide semiconductor (CMOS), bipolar complementary metal oxide semiconductor (BiCMOS) or gallium arsenide (GaAs) technologies. In addition, independent devices can be used to implement the invention.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A bias circuit, comprising:
   a transistor having a control gate, a first terminal and a second terminal coupled to a ground level;
   a first resistor coupled to the control gate;
   a first capacitor coupled between an input signal and the first resistor;
   a diode coupled between a connection point of the first capacitor and the first resistor and the ground level;
   a second capacitor coupled between the control gate and the ground level;
   a second resistor coupled between the control gate and the ground level;
   a third resistor coupled between the control gate and a predetermined voltage;
   a fourth resistor coupled between the predetermined voltage and the first terminal; and
   a fifth resistor coupled between the first terminal and a bias signal,
   wherein a current through the transistor corresponds to the input signal, and the bias signal is generated according to the current through the transistor.

2. The bias circuit as claimed in claim 1, wherein the first resistor and the second capacitor form a low pass filter.

3. The bias circuit as claimed in claim 1, wherein the diode and the first capacitor form a half wave rectifier.

4. The bias circuit as claimed in claim 1, wherein the diode is a diode-connected transistor.

5. The bias circuit as claimed in claim 1, wherein the bias circuit adjusts the bias signal according to the first resistor, the fourth resistor and a ratio of the second resistor and the third resistor.

6. The bias circuit as claimed in claim 1, wherein the transistor is a MOS, FET, BJT or HBT transistor.

7. A signal amplifier circuit, comprising:
   an amplifier generating an output signal according to an input signal and a bias signal;
   a first capacitor coupled between the input signal and the amplifier; and
   a bias adjustment circuit coupled between the input signal and the amplifier, comprising:
      a rectifier circuit adjusting a waveform of the input signal to generate a rectifier signal;
      a filter circuit generating a DC signal according to the rectifier signal; and
      a bias circuit generating the bias signal to the amplifier according to the DC signal.

8. The signal amplifier circuit as claimed in claim 7, wherein the rectifier circuit comprises:
   a second capacitor coupled between the input signal and the filter circuit; and
   a diode coupled between the filter circuit and a ground level.

9. The signal amplifier circuit as claimed in claim 8, wherein the diode is a diode-connected transistor.

10. The signal amplifier circuit as claimed in claim 7, wherein the filter circuit comprises:
   a first resistor coupled between the rectifier circuit and the bias circuit; and
   a third capacitor coupled between the bias circuit and the ground level.

11. The signal amplifier circuit as claimed in claim 10, wherein the bias circuit adjusts the bias signal according to the first resistor.

12. The signal amplifier circuit as claimed in claim 7, wherein the bias circuit comprises:
   a second resistor coupled between the filter circuit and a predetermined voltage;
   a third resistor coupled between the filter circuit and the ground level;
   a fourth resistor coupled to the predetermined voltage;
   a transistor having a control gate coupled to the filter circuit, a first terminal coupled to the fourth resistor, and a second terminal coupled to the ground level; and
   a fifth resistor coupled between the fourth resistor and the amplifier.

13. The signal amplifier circuit as claimed in claim 12, wherein the transistor is a MOS, FET, BJT or HBT transistor.

14. The signal amplifier circuit as claimed in claim 12, wherein the bias circuit adjusts the bias signal according to the fourth resistor.

15. The signal amplifier circuit as claimed in claim 12, wherein the bias circuit adjusts the bias signal according to a ratio of the second resistor and the third resistor.

16. The signal amplifier circuit as claimed in claim 7, wherein the filter circuit is a low pass filter.

17. The signal amplifier circuit as claimed in claim 7, wherein the rectifier circuit adjusts the input signal according to a reference voltage to generate a rectifier signal less than or equal to the reference voltage.

18. A signal amplifier circuit, comprising:
   an amplifier generating an output signal according to an input signal and a bias signal;
   a first capacitance coupled between the input signal and the amplifier;
   a transistor having a control gate, a first terminal and a second terminal coupled to a ground level;
   a first resistor coupled to the control gate;
   a second capacitor coupled between the input signal and the first resistor;
   a diode coupled between a connection point of the second capacitor and the first resistor and the ground level;
   a third capacitor coupled between the control gate and the ground level;
   a second resistor coupled between the control gate and a predetermined voltage;
   a third resistor coupled between the control gate and the ground level;
   a fourth resistor coupled between the predetermined voltage and the first terminal; and
   a fifth resistor coupled between the first terminal and the amplifier,
   wherein a current through the transistor corresponds to the input signal, and the bias signal is generated according to the current through the transistor.

19. The signal amplifier circuit as claimed in claim 18, wherein the first resistor and the third capacitor form a low pass filter.

20. The signal amplifier circuit as claimed in claim 18, wherein the diode and the second capacitor form a half wave rectifier.

21. The signal amplifier circuit as claimed in claim 18, wherein the diode is a diode-connected transistor.

22. The signal amplifier circuit as claimed in claim 18, wherein the bias circuit adjusts the bias signal according to the first resistor, the fourth resistor and a ratio of the second resistor and the third resistor.

23. The signal amplifier circuit as claimed in claim 18, wherein the transistor is a MOS, FET, BJT or HBT transistor.

* * * * *